June 3, 1969 R. D. BAERTSCH 3,448,351

CRYOGENIC AVALANCHE PHOTODIODE OF InSb WITH NEGATIVE RESISTANCE CHARACTERISTIC AT POTENTIAL GREATER THAN REVERSE BREAKDOWN

Filed June 1, 1967

Inventor:
Richard D. Baertsch,
by Marvin Snyder
His Attorney.

United States Patent Office 3,448,351
Patented June 3, 1969

3,448,351
CRYOGENIC AVALANCHE PHOTODIODE OF InSb WITH NEGATIVE RESISTANCE CHARACTERISTIC AT POTENTIAL GREATER THAN REVERSE BREAKDOWN

Richard D. Baertsch, Schenectady, N.Y., assignor to General Electric Company, a corporation of New York Filed June 1, 1967, Ser. No. 642,793
Int. Cl. H01l 3/00, 5/00
U.S. Cl. 317—234 11 Claims

ABSTRACT OF THE DISCLOSURE

An indium antimonide photodiode which produces high photocurrents when reverse biased just below breakdown. At still higher bias levels, the photodiode exhibits a current controlled negative resistance. The photodiode comprises a p-type surface layer diffused into an n-type semiconductor wafer, with a mesa electrolytically etched thereon. The region where the junction comes to the surface is coated with black wax which is covered with black paint, preventing degradation in current-voltage characteristics due to exposure to room light.

*Background of the invention*

This invention relates to cryogenic semiconductor photodiodes, and more particularly to indium antimonide photodiodes which produce an increase in photocurrent with increasing reverse bias and, at still higher bias levels, exhibit a current-controlled negative resistance.

Photovoltaic indium antimonide diodes for detection of infrared radiation have been well-known in the art. However, such photovoltaic diodes exhibit a limited photocurrent for a given photon flux. According to the present invention, a highly desirable increase in the level of photocurrent over that produced by photovoltaic indium antimonide diodes may be obtained by reverse biasing an indium antimonide near, but just below, breakdown. This increase in photocurrent with voltage is caused by energetic primary electrons creating secondary hole-electron pairs by impact ionization. The gain obtained in this manner is commonly known as avalanche gain.

The indium antimonide photodiode of the instant invention, which is operable at temperatures of from 20° K. to 140° K., detects radiation from 1 to 5.5 microns in wavelength when operated at a temperature of 77° K. In addition, as the bias voltage applied to the photodiode is increased further, the voltage across the photodiode switches to a lower value while the current is still increasing; that is, the diode exhibits a current controlled negative resistance. The device is thus useful both as a photodiode with gain and as a negative resistance device.

*Brief summary of the invention*

Briefly, in accordance with a preferred embodiment of the invention, a cryogenic infrared avalanche photodiode exhibiting a negative resistance region is provided. This photodiode comprises a wafer of indium antimonide of one conductivity type having a surface region of opposite conductivity type diffused into a radiation receiving surface of the wafer so as to form a planar p-n junction therein substantially parallel to the surface. Visible radiation blocking means are adhered to the wafer at each surface intersecting the plane of the junction so as to completely coat the intersection.

Accordingly, one object of the invention is to provide a cryogenic infrared radiation responsive photodiode which exhibits a gain.

Another object is to provide an indium antimonide photodiode which exhibits a negative resistance at high reverse bias levels.

Another object is to provide an indium antimonide photodiode capable of withstanding exposure to room light without degradation of its current-voltage characteristics.

The features of the invention believed to be novel are set forth with particularity in the appended claims. The invention itself, however, both as to organization and method of opeartion, together with further objects and advantages thereof, may best be understood by reference to the following description taken in conjunction with the accompanying drawings in which:

*Description of the preferred embodiments*

Figure 1:
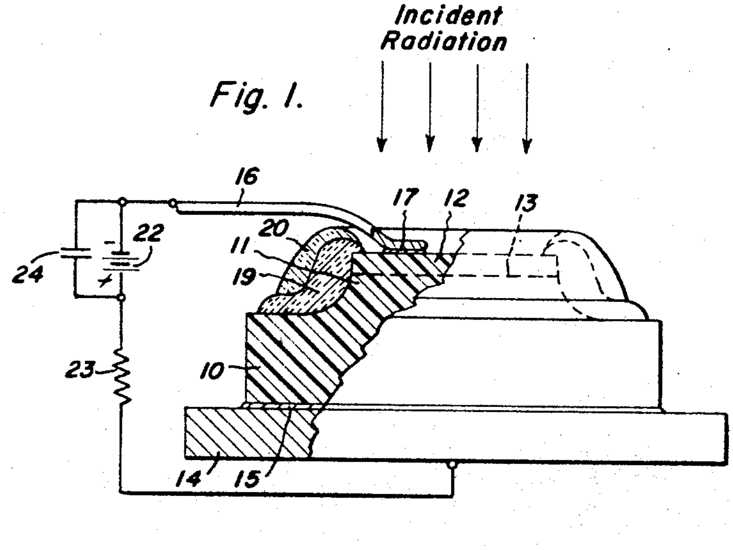
FIGURE 1 is a partially cut away view of the photodiode of the instant invention.

FIGURE 1 illustartes the complete photodiode of the instant invention, partially cut away to expose the device in section. A wafer of indium antimonide of one type conductivity, such as n-type, having a mesa 11, contains a region 12 of opposite type conductivity, such as p-type, diffused therein, resulting in a p-n junction represented by a dotted line 13. Wafer 10 is alloyed through a layer of indium or tin 15 to a Kovar header 14, which comprises an alloy of 17–18% cobalt, 28–29% nickel, and the remainder iron. Contact to p-type region 12 is made by soldering a wire 16 such as platinum thereto with indium solder 17. The region where junction 13 comes to the suaface of mesa 11 is coated with black wax (such as Apiezon W) which, in turn, is covered with black paint 20. This prevents room light from impinging upon junction 13 and degrading the current-voltage characteristics of the photodiode. Incident infrared radiation is indicated by the arrows directed toward the surface of p-type region 12.

Reverse bias at a level just below that required for breakdown of the pohtodiode is applied across p-n junction 13 by means of a D-C power supply 22 connected to lead 16 and header 14 in series with a load resistance 23. A capacitance 24 may be connected in parallel with power supply 22 in order to by-pass the power supply impedance to A-C signals.

In operation, the device of FIGURE 1 may conveniently be maintained in a cryostat (not shown) at a cryogenic temperature level, typically 77° K., by being mounted in a cryostat which is evacuated to a pressure of less than $10^{-5}$ torr. Incident infrared radiation is permitted to impinge upon the surface of p-type region 12 through a sapphire window in the cryostat. This radiation may be pulsed, as by chopping with a rotary wheel in a manner well-known in the art, or by producing bursts of light from the infrared source, so that an A-C voltage is developed across load resistance 23 which may then be synchronously detected, as by use of a phase sensitive amplifier. Alternatively, the infrared radiation may be steady in nature.

Figure 2:
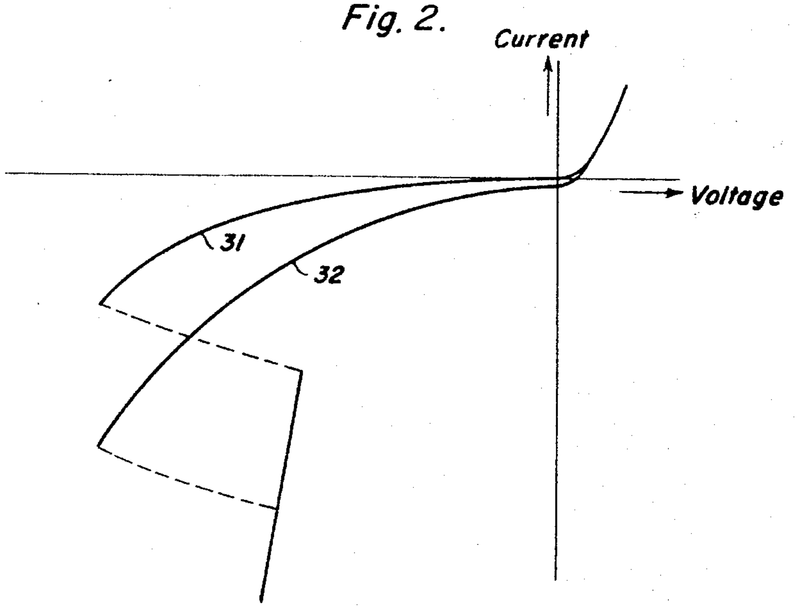
FIGURE 2 shows typical voltage-current characteristics for the device shown in FIGURE 1.

FIGURE 2 illustrates current-voltage characteristics for the photodiode of FIGURE 1. In particular, curve 31 represents the photodiode characteristic when no radiation impinges thereon, while curve 32 represents the photodiode characteristic when infrared radiation impinges thereon. Thus, whether or not the photodiode is illuminated with infrared radiation, a negative resistance region, represented by the dotted lines on curves 31 and 32, is exhibited. Typical values of photodiode breakdown voltage, or voltage across the photodiode at which the photodiode switches into its negative resistance region, range from 6 to 20 volts, making the photodiode particularly suitable to switching circuit applications.

Fabrication of the indium antimonide photodiode of the instant invention begins with a crystal of n-type indium antimonide having a concentration of between $5\times10^{13}$, and $5\times10^{14}$ donors per cubic centimeter, typically about $2\times10^{14}$. The crystal is cut, lapped, and polished by techniques conventional in the semiconductor art, into wafers approximately 20 mils thick and oriented, with reference to crystallographic axes, in the <100> plane. The polished wafers are then sealed into an evacuated quartz tube along with a small amount of zinc or cadmium which has been alloyed with antimony or indium in order to lower the surface concentration of the zinc or cadmium. Diffusion of the zinc or cadmium into the wafer is then performed by maintaining the quartz tube at a temperature of about 400° C. for 4 to 120 hours, thereby forming a p-type layer which is from 0.5 to 20 microns thick, as illustrated by region 12 in FIGURE 1, and having a concentration of approximately $10^{17}$–$10^{19}$ acceptors per cubic centimeter. The p-type surface layer thus formed is lapped off one side of the wafer, to a thickness of about 150 microns and the wafer is cut or cleaved along the <110> directions into dice approximately 2 millimeters on each side. The dice are alloyed to a Kovar header 14, illustrated in FIGURE 1, using pure indium or tin in a hydrogen atmosphere. Platinum wire 16, shown in FIGURE 1, is then contacted to p-type layer 12 by soldering thereto with indium, taking care that the indium does not alloy through p-type surface layer 12. A mesa is then etched electrolytically in sodium hydroxide, using black wax, such as Apiezon W, as a mask. A final alkaline cleanup etch is then used to restore surface stoichiometry at the intersection of the junction with the mesa surface. One such etch is described by H. L. Henneke, Journal of Applied Physics, 36, 2967 (1965). The region where junction 13 comes to the surface of mesa 11 is then coated with black wax 19, such as Apiezon W, which in turn is then covered with black point 20. The photodiode is then ready to be operated.

Those skilled in the art will recognize that the photodiode of the instant invention may also be fabricated by the well-known planar process. In such case, the final alkaline cleanup etch need not be applied, since there is no intersection of external surfaces of the photodiode by the p-n junction thereof.

The foregoing describes a cryogenic infrared radiation response photodiode which exhibits a gain. The photodiode is comprised of indium antimonide and exhibits a negative resistance. In addition, the diode is capable of withstanding exposure to room light without degradation of its current-voltage characteristics.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

I claim:

1. An avalanche photodiode comprising: a wafer of indium antimonide of one conductivity type; a region of opposite conductivity type formed in a radiation receiving surface of the wafer so as to establish a planar p-n junction in said wafer substantially parallel to said radiation receiving surface; and visible light blocking means adhered to the surface at each surface intersecting the plane of the junction so as to completely coat said intersection, said photodiode exhibiting a negative resistance characteristic when reverse biased at a potential greater than the breakdown voltage of said photodiode.

2. The avalanche photodiode of claim 1 wherein said one conductivity type is n-type and said opposite conductivity type is p-type.

3. The avalanche photodiode of claim 2 wherein said radiation receiving surface of the wafer comprises the upper surface of a mesa formed on said indium antimonide wafer, and said surface intersection the junction comprises a side of said mesa.

4. The avalanche photodiode of claim 2 wherein the thickness of said p-type region between said radiation receiving surfaces and said p-n junction is from 0.5 to 20 microns.

5. The avalanche photodiode of claim 2 wherein the p-type conductivity region formed in said radiation receiving surface of the wafer comprises a diffused region.

6. The avalanche photodiode of claim 5 wherein the thickness of said p-type region between said radiation receiving surface and said p-n type junction is from 0.5 to 20 microns.

7. The avalanche photodiode of claim 5 wherein said diffused region includes acceptor impurities comprising one of the group consisting of zinc and cadmium.

8. The avalanche photodiode of claim 2 wherein said p-type conductivity region includes acceptor impurities comprising one of the group consisting of zinc and cadmium.

9. A cryogenic infrared avalanche photodiode comprising: an indium antimonide crystal of one conductivity type; a region of opposite conductivity type formed in an infrared radiation receiving surface of the crystal so as to establish a planar p-n junction in said crystal substantially parallel to said infrared radiation receiving surface; visible light blocking means adhered to the crystal at each surface intersecting the plane of the junction so as to completely coat said intersection; and means coupled to said photodiode for applying a reverse bias across said junction, said photodiode exhibiting a negative resistance characteristic when amplitude of said reverse bias is sufficient to cause breakdown of said photodiode.

10. The cryogenic infrared avalanche photodiode of claim 9 wherein said one conductivity type is n-type and said opposite conductivity type is p-type.

11. The cryogenic infrared avalanche photodiode of claim 10 wherein the p-type conductivity region formed in said infrared radiation receiving surface of the crystal comprises a diffused region.

References Cited

UNITED STATES PATENTS

| | | | |
|---|---|---|---|
| 3,217,379 | 11/1965 | Mesecke | 29—25.3 |
| 3,011,133 | 11/1961 | Keonig | 331—107 |
| 3,293,567 | 12/1966 | Komatsubara | 331—107 |
| 3,404,318 | 10/1968 | Lindmayer | 317—234 |

JOHN W. HUCKERT, *Priamry Examiner.*

M. EDLOW, *Assistant Examiner.*

U.S. Cl. X.R.

250—217; 317—234